(12) United States Patent
Ando et al.

(10) Patent No.: US 8,865,551 B2
(45) Date of Patent: *Oct. 21, 2014

(54) REDUCING THE INVERSION OXIDE THICKNESS OF A HIGH-K STACK FABRICATED ON HIGH MOBILITY SEMICONDUCTOR MATERIAL

(75) Inventors: Takashi Ando, Tuckahoe, NY (US); Martin M. Frank, Dobbs Ferry, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/536,764

(22) Filed: Jun. 28, 2012

(65) Prior Publication Data

US 2014/0004674 A1 Jan. 2, 2014

(51) Int. Cl.
*H01L 29/772* (2006.01)
*H01L 29/78* (2006.01)
*H01L 21/8234* (2006.01)

(52) U.S. Cl.
CPC .. *H01L 21/823462* (2013.01); *H01L 21/82345* (2013.01)
USPC ........... 438/283; 438/197; 438/287; 257/288; 257/E29.128; 257/E28.159; 257/E21.623

(58) Field of Classification Search
CPC ................. H01L 21/28176; H01L 21/823437; H01L 21/82345; H01L 21/823462; H01L 21/823828; H01L 21/823842; H01L 21/823857; H01L 21/823443; H01L 21/823834
USPC .......... 438/216, 261, 287, 197, 283; 257/202, 257/288, 410–412, E27.06, 257/E29.127–E29.128, E29.152, E29.14, 257/E29.134, E29.158–E29.16, E21.623, 257/E21.637
See application file for complete search history.

(56) References Cited

U.S. PATENT DOCUMENTS 7,226,831 B1 6/2007 Metz et al.
7,598,545 B2 10/2009 Cartier et al.
(Continued)

OTHER PUBLICATIONS

H. Y. Lee et al., "HfOx Bipolar Resistive Memory With Robust Endurance Using AlCu as Buffer Electrode," IEEE Electron Device Letters, vol. 30, No. 7, 2009, pp. 703-705.

(Continued)

*Primary Examiner* — Laura Menz
*Assistant Examiner* — Maliheh Malek
(74) *Attorney, Agent, or Firm* — Jon A Gibbons; Fleit Gibbons Gutman Bongini & Bianco PL

(57) ABSTRACT

A high mobility semiconductor layer is formed over a semiconductor substrate. An interfacial oxide layer is formed over the high mobility semiconductor layer. A high dielectric constant (high-k) dielectric layer is formed over the interfacial oxide layer. A stack is formed over the high-k dielectric layer. The stack comprises a lower metal layer, a scavenging metal layer comprising a scavenging metal, and an upper metal layer formed on the scavenging metal layer. A Gibbs free energy change of a chemical reaction, in which an atom constituting the high mobility semiconductor layer that directly contacts the interfacial oxide layer combines with a metal oxide material comprising the scavenging metal and oxygen to form the scavenging metal in elemental form and oxide of the atom constituting the high mobility semiconductor layer that directly contacts the interfacial oxide layer, is positive. A gate electrode and a gate dielectric are formed.

9 Claims, 4 Drawing Sheets

(56) References Cited

U.S. PATENT DOCUMENTS

| | | | | |
|---|---|---|---|---|
| 7,989,902 | B2* | 8/2011 | Ando et al. | 257/410 |
| 8,367,496 | B2* | 2/2013 | Ando et al. | 438/216 |
| 8,513,724 | B2* | 8/2013 | Takeoka | 257/310 |
| 2005/0161189 | A1 | 7/2005 | Sercombe et al. | |
| 2009/0014809 | A1* | 1/2009 | Sekine et al. | 257/369 |
| 2009/0152636 | A1* | 6/2009 | Chudzik et al. | 257/369 |
| 2009/0212371 | A1* | 8/2009 | Kobayashi | 257/369 |
| 2010/0099245 | A1* | 4/2010 | Hyun et al. | 438/585 |
| 2010/0187610 | A1* | 7/2010 | Kwon et al. | 257/369 |
| 2010/0187612 | A1* | 7/2010 | Ikeno et al. | 257/369 |
| 2010/0187643 | A1 | 7/2010 | Chudzik et al. | |
| 2010/0244206 | A1 | 9/2010 | Bu et al. | |
| 2010/0320547 | A1* | 12/2010 | Ando et al. | 257/411 |
| 2011/0204475 | A1* | 8/2011 | Rui et al. | 257/532 |
| 2011/0207280 | A1 | 8/2011 | Ando et al. | |
| 2011/0254063 | A1* | 10/2011 | Chen et al. | 257/288 |
| 2011/0291198 | A1* | 12/2011 | Ando et al. | 257/368 |
| 2012/0021596 | A1* | 1/2012 | Han et al. | 438/591 |
| 2012/0049297 | A1* | 3/2012 | Takeoka | 257/410 |
| 2012/0193726 | A1* | 8/2012 | Yamashita et al. | 257/369 |
| 2012/0214296 | A1* | 8/2012 | Hyun et al. | 438/585 |
| 2012/0256249 | A1* | 10/2012 | Nakasaki et al. | 257/324 |
| 2012/0286363 | A1* | 11/2012 | Ando et al. | 257/368 |
| 2013/0001668 | A1* | 1/2013 | Frank | 257/315 |
| 2013/0001743 | A1 | 1/2013 | Frank | |
| 2013/0005132 | A1* | 1/2013 | Frank | 438/591 |
| 2013/0009219 | A1* | 1/2013 | Yamazaki et al. | 257/288 |
| 2013/0032886 | A1* | 2/2013 | Ando et al. | 257/369 |
| 2013/0034940 | A1* | 2/2013 | Ando et al. | 438/199 |
| 2013/0072015 | A1* | 3/2013 | Chen et al. | 438/663 |
| 2013/0078779 | A1 | 3/2013 | Xu | |
| 2014/0001573 | A1* | 1/2014 | Ando et al. | 257/410 |
| 2014/0004695 | A1* | 1/2014 | Ando et al. | 438/591 |

OTHER PUBLICATIONS

M.-C. Wu et al., "Highly Stable SrZrO3 Bipolar Resistive Switching Memory by Ti Modulation Layer," ECS Trans., vol. 28, No. 2, 2010, pp. 411-420.

T. Ando et al., "Ultimate EOT Scaling (< 5Å) Using Hf-Based High-k Gate Dielectrics and Impact on Carrier Mobility," ECS Trans., vol. 28, No. 1, 2010, pp. 115-123.

M. M. Frank, "High-k/metal gate innovations enabling continued CMOS scaling," Proceedings of the ESSCIRC, Sep. 12-16, 2011, pp. 50-58.

Final Office Action dated Nov. 12, 2013 for U.S. Appl. No. 13/614,962.

Non Final Office Action dated Feb. 14, 2014 received for U.S. Appl. No. 13/614,962.

\* cited by examiner

REDUCING THE INVERSION OXIDE THICKNESS OF A HIGH-K STACK FABRICATED ON HIGH MOBILITY SEMICONDUCTOR MATERIAL

FIELD OF THE INVENTION

The present invention generally relates to the field of semiconductors, and more particularly relates to a metal gate stack included in an electrode over a high-k gate dielectric fabricated on a high mobility semiconductor material, and method of manufacturing the same.

BACKGROUND OF THE INVENTION

Scaling of the gate dielectric is a challenge in improving performance of advanced field effect transistors. In a field effect transistor employing a silicon oxide based gate dielectric, the leakage current through the gate dielectric increases exponentially with the decrease in the thickness of the gate dielectric. Such devices typically become too leaky to provide high performance at or below the thickness of 1.1 nm for the silicon oxide gate dielectric.

High-k gate dielectric provides a way of scaling down the thickness of the gate dielectric without an excessive increase in the gate leakage current. However, high-k gate dielectric materials are prone to a change in the effective oxide thickness (EOT) because high-k gate dielectric materials react with oxygen that diffuses through the gate electrode or gate spacers. Regrowth of a silicon oxide interfacial layer between a silicon substrate and the high-k gate dielectric during high-temperature processing steps is a major obstacle to successful effective oxide thickness scaling. Particularly, typical stacks of a high-k gate dielectric and a metal gate is known to be susceptible to a high temperature anneal in an oxygen ambient. Such a high temperature anneal in oxygen ambient results in regrowth of the silicon oxide interfacial layer and produces instability of the threshold voltage of field effect transistors.

SUMMARY OF THE INVENTION

In one embodiment, a method of forming a semiconductor structure is disclosed. The method comprises forming a high mobility semiconductor layer over a semiconductor substrate. An interfacial oxide layer is formed over the high mobility semiconductor layer. A high dielectric constant (high-k) dielectric layer is formed over the interfacial oxide layer. A stack is formed over the high-k dielectric layer. The stack comprises a lower metal layer formed on the high-k layer, a scavenging metal layer comprising a scavenging metal formed on the lower metal layer, and an upper metal layer formed on the scavenging metal layer. A Gibbs free energy change of a chemical reaction, in which an atom constituting the high mobility semiconductor layer that directly contacts the interfacial oxide layer combines with a metal oxide material comprising the scavenging metal and oxygen to form the scavenging metal in elemental form and oxide of the atom constituting the high mobility semiconductor layer that directly contacts the interfacial oxide layer, is positive. A gate electrode and a gate dielectric are formed. The gate electrode is formed by patterning the stack, and wherein the gate dielectric includes a portion of the high-k dielectric layer.

Other objects, features, and advantages of the present invention will become apparent from the following detailed description. It should be understood, however, that the detailed description and specific examples, while indicating various embodiments of the present invention, are given by way of illustration only and various modifications may naturally be performed without deviating from the present invention.

DETAILED DESCRIPTION

Figure 1:
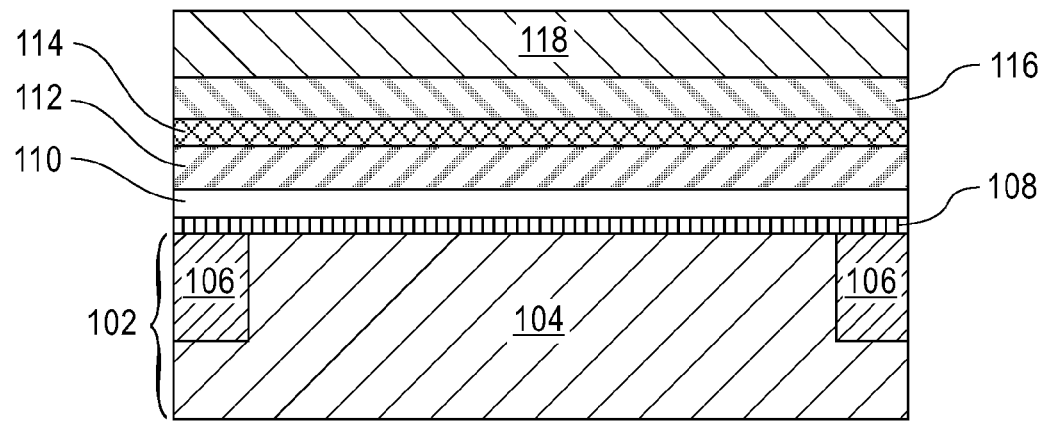
FIG. 1 is a vertical cross-sectional view of a semiconductor structure after formation of a high-k dielectric layer, a lower metal layer, a scavenger metal layer, an upper metal layer, and a polycrystalline semiconductor layer according to one embodiment of the present invention.

FIG. 1 shows one example of a semiconductor structure according to one embodiment of the present invention. This semiconductor structure comprises a semiconductor substrate 102 and a stack of material layers formed thereupon. The semiconductor substrate 102 comprises a substrate semiconductor layer 104 and shallow trench isolation structures 106. The shallow trench isolation structures 106 comprise a dielectric material such as silicon oxide or silicon nitride, and are formed by methods well known in the art.

The substrate semiconductor layer 104 comprises a high-mobility channel material, where "high-mobility" indicates that the has a carrier mobility, i.e., electron and/or hole mobility, higher than doped silicon. For example, the substrate semiconductor layer 104, in one embodiment, comprises a material such as, but not limited to, germanium (Ge), gallium arsenide (GaAs), indium gallium arsenide (InGaAs), indium arsenide (InAs), indium phosphide (InP), aluminum gallium arsenide (AlGaAs), indium antimonide (InSb), indium aluminum arsenide (InAlAs). III-V compound semiconductor materials, II-VI compound semiconductor materials, organic semiconductor materials, and other compound semiconductor materials.

In one embodiment, the semiconductor layer 104 in its entirety comprises the high-mobility channel material. However, in another embodiment, the semiconductor layer 104 comprises silicon (Si) with a high-mobility channel material grown or deposited on the Si in the channel region. For example, Ge can be epitaxially grown on an underlying layer of silicon or a silicon-containing semiconductor. In this embodiment, the substrate can be a bulk substrate, an SOI substrate, or a hybrid substrate. Combining the high mobility channel material with Si enables the use of Si as a passive substrate and parts of well known Si CMOS processing techniques can be utilized to integrate high mobility channels into a CMOS flow. In addition, Si wafers are available in large wafer sizes not currently available for many high-mobility channel materials, hence growth/bonding of these high-mobility channel materials onto Si enables 300 mm wafer sizes that are standard in the CMOS industry.

The semiconductor material of the substrate semiconductor layer 104, in one embodiment, is appropriately doped either with p-type dopant atoms or with n-type dopant atoms. The dopant concentration of the substrate semiconductor layer 104, in one embodiment, can be from $1.0 \times 10^{15}/cm^3$ to $1.0 \times 10^{19}/cm^3$, and typically ranges from $1.0 \times 10^{16}/cm^3$ to $3.0 \times 10^{18}/cm^3$, although lesser and greater dopant concentrations are applicable as well.

In one embodiment, an unpatterned chemical oxide layer 108 (also referred to herein as "gate oxide 108") is formed on the exposed semiconductor surface of the substrate semiconductor layer 104, which comprises the high-mobility channel material. An unpatterned high dielectric constant (high-k) dielectric layer 110 is formed directly on the top surface of the unpatterned chemical oxide layer 108. In an embodiment where the unpatterned chemical oxide layer 108 is not formed, the deposition of the unpatterned high dielectric constant (high-k) dielectric layer 110 and subsequent thermal processes lead to the formation of a pre-existing interfacial oxide layer between the substrate semiconductor layer 104 and the unpatterned high dielectric constant (high-k) dielectric layer 110.

The unpatterned chemical oxide layer 108 can be formed by treatment of exposed semiconductor surfaces with a chemical. For example, the process step for this wet chemical oxidation may include treating a cleaned semiconductor surface (such as a semiconductor surface treated with hydrofluoric acid) with a mixture of ammonium hydroxide, hydrogen peroxide and water (in a 1:1:5 ratio) at 65° C. Alternately, the chemical oxide layer can also be formed by treating the HF-last semiconductor surface in ozonated aqueous solutions, with the ozone concentration usually varying from, but not limited to: 2 parts per million (ppm) to 40 ppm. The unpatterned chemical oxide layer 108 helps minimize mobility degradation in the substrate semiconductor layer 104 due to high-k dielectric material in the unpatterned high-k dielectric layer 110. In one embodiment, the unpatterned chemical oxide layer 108 is an oxide of the underlying high-mobility channel material. Typically, the thickness of the unpatterned chemical oxide layer 108 is from 0.1 nm to 0.4 nm, although lesser and greater thicknesses are also applicable as well.

The unpatterned high-k dielectric layer 110 comprises a high dielectric constant (high-k) material including a dielectric metal oxide and having a dielectric constant that is greater than the dielectric constant of silicon nitride of 7.5. The unpatterned high-k dielectric layer 110 is formed using one or more methods well known in the art including, for example, chemical vapor deposition (CVD), atomic layer deposition (ALD), molecular beam deposition (MBD), pulsed laser deposition (PLD), liquid source misted chemical deposition (LSMCD), etc.

The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the unpatterned high-k dielectric layer 110 may be from 1 nm to 10 nm, and in one embodiment is from 1.5 nm to 3 nm. The unpatterned high-k dielectric layer, in one embodiment, has an effective oxide thickness (EOT) on the order of, or less than, 1 nm.

An unpatterned lower metal layer 112 is deposited directly on the top surface of the unpatterned high-k dielectric layer 110. The unpatterned lower metal layer 112 is formed by, for example, chemical vapor deposition (CVD), physical vapor deposition (PVD), or atomic layer deposition (ALD). The material of the unpatterned lower metal layer 112 is herein referred to as a "first metallic compound". In one embodiment, the first metallic compound is a conductive transition metal nitride or a conductive transition metal carbide. The first metallic compound is a compound of a first metallic element selected from transition metals and a non-metallic element. If the non-metallic element is nitrogen, the first metallic compound is a transition metal nitride. If the non-metallic element is carbon, the first metallic compound is a transition metal carbide. For example, the first metallic compound may be selected from TiN, TiC, TaN, TaC, and a combination thereof. As used herein, transition metals include elements from Group 3B, 4B, 5B, 6B, 7B, 8B, 1B, and 2B and Lanthanides and Actinides in the Periodic Table of the Elements. The thickness of the unpatterned lower metal layer 112, in one embodiment, is from 0.1 nm to 10 nm, and in another embodiment ranges from 3 nm to 10 nm, although lesser and greater thicknesses are also applicable as well.

An unpatterned scavenging metal layer 114 is deposited directly on the top surface of the unpatterned lower metal layer 112. The unpatterned scavenging metal layer 114 is formed, for example, by chemical vapor deposition (CVD), physical vapor deposition (PVD), or atomic layer deposition (ALD). In one embodiment, the first exemplary semiconductor structure is transferred from a processing chamber that deposits the unpatterned lower metal layer 112 to another processing chamber that deposits the unpatterned scavenging metal layer 114 without breaking vacuum to prevent formation of any interfacial layer by oxidation or introduction of oxygen into the unpatterned lower metal layer 112.

The material of the unpatterned scavenging metal layer 114 "scavenges" impurity oxygen from neighboring metallic layers during subsequent processing. For the unpatterned scavenging metal layer 114 to effectively scavenge impurity oxygen in subsequent processing steps, it is necessary that introduction of oxygen into the unpatterned scavenging metal layer 114 is suppressed during the formation step. Further, the material for the unpatterned scavenging metal layer 114 is selected so that the material of the unpatterned scavenging metal layer 114 effectively scavenges impurity oxygen atoms from the unpatterned lower metal layer 112 and an unpatterned upper metal layer 116 to be subsequently formed.

In one embodiment, the unpatterned scavenging metal layer 114 comprises of at least one alkaline earth metal. In another embodiment, the unpatterned scavenging metal layer 114 comprises at least one transition metal. In yet another embodiment, the unpatterned scavenging metal layer 114 comprises of a mixture of at least one alkaline earth metal and at least one transition metal. The thickness of the unpatterned scavenging metal layer 114, in one embodiment, is from 0.1 nm to 3.0 nm, although lesser and greater thicknesses are applicable as well.

An unpatterned upper metal layer 116 is deposited directly on the top surface of the unpatterned scavenging metal layer 114. The unpatterned upper metal layer 116 is formed, for example, by chemical vapor deposition (CVD), physical vapor deposition (PVD), or atomic layer deposition (ALD). In one embodiment, the semiconductor structure is transferred from the processing chamber that deposits the unpatterned scavenging metal layer 114 to a processing chamber that deposits the unpatterned upper metal layer 116 without breaking vacuum to prevent formation of any interfacial layer by oxidation or introduction of oxygen into the unpatterned scavenging metal layer 114.

The material of the unpatterned upper metal layer 116 is herein referred to as a "second metallic compound". In one embodiment, the second metallic compound is a conductive transition metal nitride or a conductive transition metal carbide. The second metallic compound is a compound of a second metallic element selected from transition metals and a non-metallic element. If the non-metallic element is nitrogen, the second metallic compound is a transition metal nitride. If the non-metallic element is carbon, the second metallic compound is a transition metal carbide. For example, the second metallic compound may be selected from TiN, TiC, TaN, TaC, and a combination thereof. The thickness of the unpatterned upper metal layer 116, in one embodiment, is from 0.1 nm to 10 nm, and in another embodiment, is from 3 nm to 10 nm, although lesser and greater thicknesses are also applicable as well herein. In one embodiment, the first metallic compound and the second metallic compound are the same material. In another embodiment, the first metal compound and the second metal compound are different materials.

The metal included within the unpatterned scavenging metal layer 114 is selected such that the Gibbs free energy change of the chemical reaction, in which an atom constituting the semiconductor layer 104 that directly contacts/abuts the interfacial/gate oxide layer 108 (or chemical oxide layer 208) combines with a metal oxide material including the scavenging metal 114 and oxygen to form the scavenging metal 114 in elemental form and oxide of the atom constituting the semiconductor layer 104 that directly contacts the interfacial/gate oxide layer 108 (or chemical oxide layer 208), is positive.

Even further, the selection of the metal included within the unpatterned scavenging metal layer 114 is dependent upon the channel material of the device. For example, when the semiconductor layer 104 comprises a high-mobility channel material such as Ge, one or more of the following materials are selected for the unpatterned scavenging metal layer 114: Al, B, Ba, Be, C, Ca, Cb, Ce, Cr, Cs, Dy, Er, Ga, Hf, In, La, Li, Lu, Mg, Mn, Na, P, Pr, Sc, Si, Sr, Ta, Th, Ti, V, Y, Zn, and Zr. Each of these materials satisfy the above criteria when the channel material of the device is Ge and each first and second metallic compounds of the unpatterned lower metal layer 112 and unpatterned upper metal layer 116 comprise TiN, TiC, TaN, TaC, or a combination thereof.

When the semiconductor layer 104 comprises a high-mobility channel material such as GaAs and/or InGaAs, one or more of the following materials are selected for the unpatterned scavenging metal layer 114: Al, B, Ba, Be, C, Ca, Cb, Ce, Cr, Dy, Er, Hf, La, Li, Lu, Mg, Mn, Na, Pr, Sc, Si, Sr, Ta, Th, Ti, V, Y, and Zr. Each of these materials satisfy the above criteria when the channel material of the device is GaAs and/or InGaAs and each first and second metallic compounds of the unpatterned lower metal layer 112 and unpatterned upper metal layer 116 comprise TiN, TiC, TaN, TaC, or a combination thereof.

When the semiconductor layer 104 comprises a high-mobility channel material such as InP, InSb, and/or InAs one or more of the following materials are selected for the unpatterned scavenging metal layer 114: Al, B, Ba, Be, C, Ca, Cb, Ce, Cr, Cs, Dy, Er, Ga, Hf, La, Li, Lu, Mg, Mn, Na, Pr, Sc, Si, Sr, Ta, Ta, Th, Ti, V, Y, Zn, and Zr. Each of these materials satisfy the above criteria when the channel material of the device is InP, InSb, and/or InAs and each first and second metallic compounds of the unpatterned lower metal layer 112 and unpatterned upper metal layer 116 comprise TiN, TiC, TaN, TaC, or a combination thereof.

When the semiconductor layer 104 comprises a high-mobility channel material such as AlGaAs and/or InAlAs one or more of the following materials are selected for the unpatterned scavenging metal layer 114: Be, Ca, Hf, La, Li, Mg, Sr, and Th. Each of these materials satisfy the above criteria when the channel material of the device is AlGaAs and/or InAlAs and each first and second metallic compounds of the unpatterned lower metal layer 112 and unpatterned upper metal layer 116 comprise TiN, TiC, TaN, TaC, or a combination thereof.

Continuing with FIG. 1, an unpatterned polycrystalline semiconductor layer 118, in one embodiment, is deposited directly on the top surface of the unpatterned upper metal layer 116, for example, by low pressure chemical vapor deposition (LPCVD), rapid thermal chemical vapor deposition (RTCVD), or plasma enhanced chemical vapor deposition (PECVD). The unpatterned polycrystalline semiconductor layer 118 comprises, for example, polysilicon, a polycrystalline silicon germanium alloy, a polycrystalline silicon carbon alloy, or a polycrystalline silicon germanium carbon alloy. The unpatterned polycrystalline semiconductor layer 118, in another embodiment, comprises a low resistivity metal such as, but not limited to, W (e.g., 5-30 $\mu\Omega$/cm), Al (e.g., 2-10 $\mu\Omega$/cm), etc. The unpatterned polycrystalline semiconductor layer 118, in on embodiment, is formed as a doped polycrystalline semiconductor layer through in-situ doping.

Alternately, the unpatterned polycrystalline semiconductor layer 118 can be doped by ion implantation of dopant atoms after deposition of the unpatterned polycrystalline semiconductor layer 118 and prior to patterning of a gate electrode. In another embodiment, implantation of dopant ions may be performed on a remaining portion of the unpatterned polycrystalline semiconductor layer 118 after patterning of the gate electrode. The thickness of the unpatterned polycrystalline semiconductor layer 118 is from, for example, 10 nm to 300 nm, and is typically from 50 nm to 100 nm, although lesser and greater thicknesses are applicable as well. In an embodiment where the unpatterned polycrystalline semiconductor layer 118 is not formed the stack of the unpatterned lower metal layer 112, unpatterned scavenging metal layer 114, and unpatterned upper metal layer 116 constitutes the gate electrode layer.

A photoresist layer (not shown) is applied to the top surface of the unpatterned polycrystalline semiconductor layer 118 and lithographically patterned to form a photoresist portion 220 (See FIG. 2), which has the shape of a gate electrode to be subsequently formed. The pattern in the photoresist portion 220 is transferred into the stack of the unpatterned polycrystalline semiconductor layer 118, the unpatterned upper metal layer 116, the unpatterned scavenging metal layer 114, the unpatterned lower metal layer 112, the unpatterned high-k dielectric layer 110, and the unpatterned chemical oxide layer 108. The pattern transfer is effected, for example, by an anisotropic etch that employs the photoresist portion 220 as an etch mask.

Figure 2:
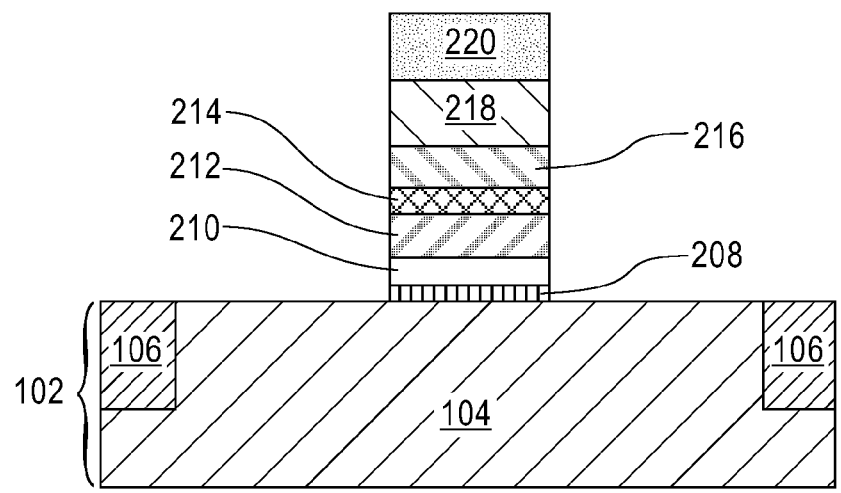
FIG. 2 is a vertical cross-sectional view of the semiconductor structure of FIG. 1 after patterning of a gate dielectric and a gate electrode according to one embodiment of the present invention.

Referring to FIG. 2, the remaining portions of the unpatterned polycrystalline semiconductor layer 118, the unpatterned upper metal layer 116, the unpatterned scavenging metal layer 114, the unpatterned lower metal layer 112 constitute a gate electrode, which include a polycrystalline semiconductor layer 218, an upper metal layer 216, a scavenging metal layer 214, and lower metal layer 212. The polycrystalline semiconductor layer 218, in one embodiment, comprises polysilicon, amorphous silicon, and/or a low resistivity metal.

The gate electrode (212, 214, 216, 218) is typically patterned as a line having a width, which is the width of the lower metal layer 212 as shown in FIG. 2 and is referred to as a "gate length". The gate length depends on the device characteristics and can be from the lithographically printable smallest dimension to 10 microns. Typically, the gate length is from 32 nm to 1 micron, although lesser and greater gate lengths are also applicable as well.

The remaining portion of the unpatterned high-k dielectric layer 110 is herein referred to as a high-k dielectric layer 210, and the remaining portion of the unpatterned chemical oxide layer 108 is herein referred to as a chemical oxide layer 208. The high-k dielectric layer 210 and the chemical oxide layer 208 collectively constitute a gate dielectric (208, 210). The gate dielectric (208, 210) has an effective oxide thickness (EOT) less than 1.2 nm, and can have an EOT less than 1.0 nm, whereas conventional non-Si EOTs are in the range of 1.5-2.5 nm. The photoresist portion 220 is subsequently removed, for example, by ashing.

The sidewalls of the gate electrode (212, 214, 216, 218) and the gate dielectric (208, 210) are typically substantially vertical, i.e., parallel to the surface normal of the exposed surface of the substrate semiconductor layer 104. Further, the sidewalls of the gate electrode (212, 214, 216, 218) and the gate dielectric (208, 210) are typically substantially vertically coincident with each other.

Figure 3:
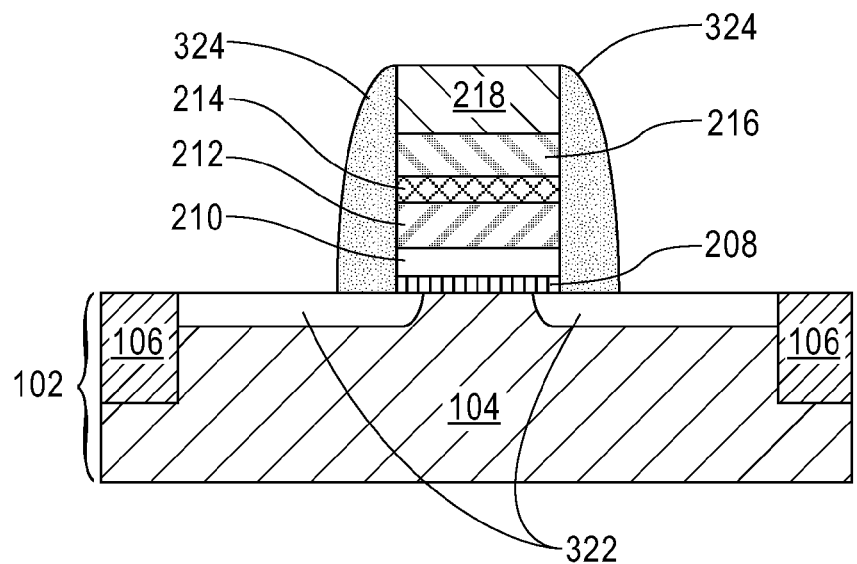
FIG. 3 is a vertical cross-sectional view of the semiconductor structure of FIG. 2 after formation of a gate spacer and source and drain extension regions according to one embodiment of the present invention.

Referring to FIG. 3, source and drain extension regions 322 are formed by ion implantation that employs the gate electrode (212, 214, 216, 218) and the gate dielectric (208, 210) as an implantation mask. The source and drain extension regions 322 have a doping of the opposite conductivity type of the doping of the substrate semiconductor layer 104. For example, if the substrate semiconductor layer 104 has a p-type doping, the source and drain extension regions 322 have an n-type doping, and vice versa. The dopant concentration of the source and drain extension regions 322 may be from $1.0 \times 10^{19}/cm^3$ to $1.0 \times 10^{21}/cm^3$, although lesser and greater dopant concentrations are applicable as well. Each of the source and drain extension regions 322 abut peripheral portions of the gate dielectric (208, 210).

Optionally, a halo implantation may be performed at this step to introduce dopants of the same conductivity type as the doping of the substrate semiconductor layer 104 to volumes of the substrate semiconductor layer 104 located underneath peripheral portions of the gate electrode (212, 214, 216, 218) and the gate dielectric (208, 210).

A gate spacer (dielectric spacer) 324 laterally abutting the sidewalls of the gate electrode (212, 214, 216, 218) and the sidewalls of the gate dielectric (208, 210) is formed, for example, by deposition of a conformal dielectric material layer followed by an anisotropic ion etching. The portion of the dielectric material layer that is formed directly on the sidewalls of the gate electrode (212, 214, 216, 218) and the gate dielectric (208, 210) remain after the anisotropic etch to constitute a gate spacer 324 that laterally surrounds the gate electrode (212, 214, 216, 218) and the gate dielectric (208, 210). In one embodiment, the gate spacer 324 includes an oxygen-impermeable material such as silicon nitride.

Figure 4:
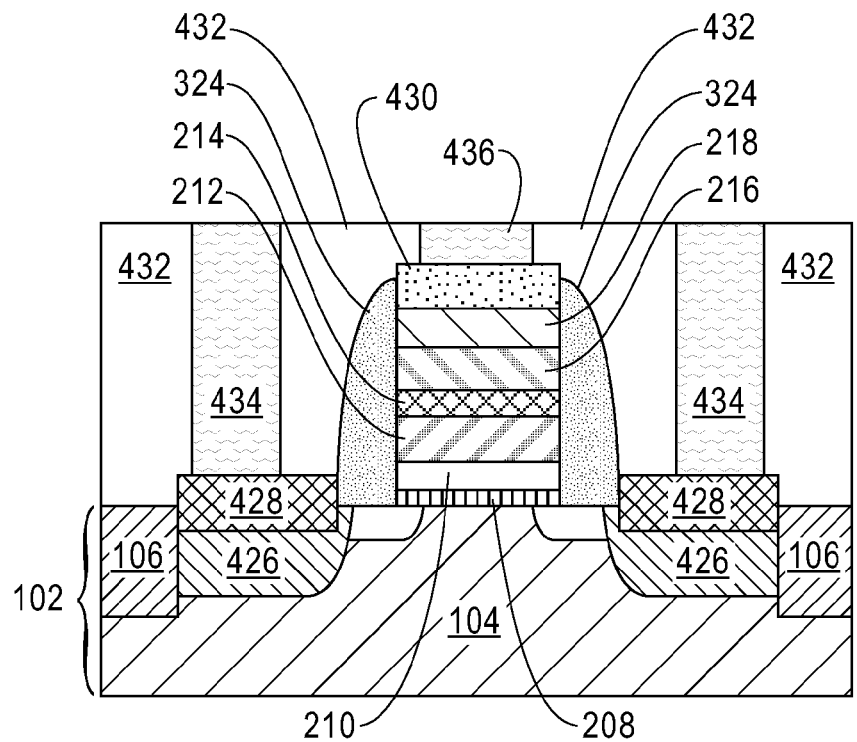
FIG. 4 is a vertical cross-sectional view of the semiconductor structure of FIG. 3 after the formation of silicide regions, a dielectric material layer, and contact vias according to one embodiment of the present invention.

Referring to FIG. 4, source and drain regions 426 are formed by ion implantation that employs the gate electrode (212, 214, 216, 218) and the gate spacer 324 as an implantation mask. The source and drain regions 426 have a doping of the same conductivity type as the doping of the source and drain extension regions 324. The dopant concentration of the source and drain regions 426 may be from $1.0 \times 10^{19}/cm^3$ to $1.0 \times 10^{21}/cm^3$, although lesser and greater dopant concentrations are applicable as well.

An activation anneal is thereafter performed to activate electrical dopants implanted within the source and drain extension regions 324 and the source and drain regions 426. Such an activation anneal is typically performed in an oxidizing ambient during which the compositional integrity of the high-k dielectric layer can be compromised in prior art semiconductor structures. In one or more embodiments, however, the thickening of the chemical oxide layer 208, if present, is prevented in the exemplary semiconductor structure in FIG. 4 because the scavenging metal layer 214 consumes oxygen that diffused downward from the polycrystalline semiconductor layer 118. In an embodiment where the chemical oxide layer 208 is absent, formation of an interfacial semiconductor oxide layer between the substrate semiconductor layer 104 and the high-k dielectric layer 210 is prevented by the same mechanism. Therefore, the flat band voltage of the structure including the substrate semiconductor layer 104, the gate dielectric (208, 210), and the lower metal gate 212 is not affected during the activation anneal or in any other thermal processing step in an oxidizing ambient.

A metal layer (not shown) is formed over the entire exposed top surfaces of the exemplary semiconductor structure and reacted with exposed semiconductor materials to form various metal semiconductor alloy regions. The metal layer comprises a metal that reacts with the semiconductor material in the source and drain regions 426 and the polycrystalline semiconductor layer 218. Non-limiting exemplary materials for the metal layer include nickel, platinum, palladium, cobalt, or a combination thereof. The formation of the metal layer may be effected by physical vapor deposition (PVD), chemical vapor deposition (CVD), or atomic layer deposition (ALD). The metal layer can be deposited in a conformal or non-conformal manner. In one embodiment, the metal deposition is substantially conformal.

The exposed semiconductor surfaces in direct contact with the metal layer are metallized by reacting with the metal in the metal layer during a metallization anneal. The metallization is effected by an anneal at a temperature from 350° C. to 550° C., which is typically performed in an inert gas atmosphere, e.g., He, Ar, $N_2$, or forming gas. In one embodiment, the anneal is performed at a temperature from 400° C. to 500° C. A continuous heating at a constant temperature or various ramping in temperature may be employed. The metallization can further be effected by an additional anneal at a temperature from 400° C. to 750° C., and, in one embodiment, is from 500° C. to 700° C. After the metallization process, unreacted portions of the metal layer, which are present over dielectric surfaces such as the gate spacer 324 and the shallow trench isolation structures 106, are removed selective to various metal semiconductor alloy portions by an etch, which may be a wet etch. A typical etchant for such a wet etch employs aqua regia. The metallization forms source and drain metal semiconductor alloy regions 428 directly on each of the source and drain regions 426. Further, a gate metal semiconductor alloy region 430 is formed directly on the top surface of the polycrystalline semiconductor layer 118.

A dielectric material layer 432 is deposited over the entirety of the top surfaces of the semiconductor structure. The dielectric material layer 432 comprises a dielectric material such as silicon oxide, silicon nitride, silicon oxynitride, or a combination thereof. In one embodiment, the dielectric material layer 432 includes a mobile ion barrier layer (not shown). The mobile ion barrier layer typically comprises an impervious dielectric material such as silicon nitride and directly contacts the various metal semiconductor alloy regions (428, 430). The dielectric material layer 432 may additionally include, for example, a spin-on-glass and/or chemical vapor deposition (CVD) oxide such as undoped silicate glass (USG), boro silicate glass (BSG), phosphosilicate glass (PSG), fluorosilicate glass (FSG), borophosphosilicate glass (BPSG), or a combination thereof. Alternately, the dielectric material layer 432 may comprise a low-k dielectric material having a dielectric constant less than 3.9 (the dielectric constant of silicon oxide), and, in one embodiment, is less than 2.5. Exemplary low-k dielectric materials include organosilicate glass (OSG) and SiLK™.

The dielectric material layer 432 is subsequently planarized to form a substantially planar top surface. Source and drain contact vias 434 and a gate contact via 436 are formed through the dielectric material layer 432 to provide electrical contact to the source and drain regions 426, respectively, and to the gate electrode (212, 214, 216, 218).

The semiconductor structure shown in FIG. 4 functions as a field effect transistor having a high-k gate dielectric and a metal gate. When a reaction having a more negative change in Gibbs free energy per oxygen atom competes with another reaction having a less negative change in Gibbs free energy per oxygen atom for a limited supply of reactants, the reaction with the more negative change in Gibbs free energy dominates the reaction and consumes a prevailing majority of the available reactants. The scavenging metal layer 214 captures oxygen atoms from above and from below, i.e., the scavenging metal layer 214 captures oxygen atoms as the oxygen atoms diffuse through the polycrystalline semiconductor layer 218 and the upper metal layer 216 in the gate electrode toward the high-k gate dielectric 210. Because the scavenging metal layer is more prone to oxide formation than the lower metal layer 212 and the upper metal layer 216, the oxygen atoms are consumed within the scavenging metal layer 214 and the oxygen atoms do not reach the high-k gate dielectric 210.

In addition, the scavenging metal layer 214 actively reduces the thickness of the chemical oxide layer 20 underneath the high-k dielectric 210 as additional oxygen atoms migrate toward the chemical oxide layer 208 from below or from the side of the chemical oxide layer 208. Such migrating oxygen atoms are captured by the scavenging metal layer 214 instead of being incorporated into the chemical oxide layer 208. Not only growth of the chemical oxide layer 208 underneath the high-k gate dielectric 210 is prevented, but the thickness of the chemical oxide layer 208 is reduced as a significant portion of the oxygen atoms in the chemical oxide layer 208 is consumed by the scavenging metal layer 214. Thus, the field effect transistor maintains a constant threshold voltage even after a high temperature anneal in oxygen ambient. By reducing and limiting the thickness of the thickness of the chemical oxide layer 208 than what is normally obtainable by conventional processing, the effective oxide thickness (EOT) of a composite gate dielectric stack, which includes the chemical oxide layer 208 and the high-k dielectric 210, is reduced, thereby enhancing the scalability of the composite gate dielectric stack and performance of the field effect transistor.

Therefore, the presence of the scavenging metal layer 214 within the gate electrode (212, 214, 216, 218) prevents oxygen atoms that diffuse down the polycrystalline semiconductor layer 118 from passing into the lower metal layer 212 because the oxygen atoms are scavenged by the scavenging metal layer 214. Therefore, the field effect transistor of one or more embodiments provides a superior reliability against oxygen diffusion that may degrade or alter the device parameters of the field effect transistor. This allows EOT (inversion oxide thickness Tinv) scaling for gate dielectrics formed on high-mobility channel materials, which enables further transistor performance improvement over counterpart gate dielectrics formed on an Si channel.

Figure 5:
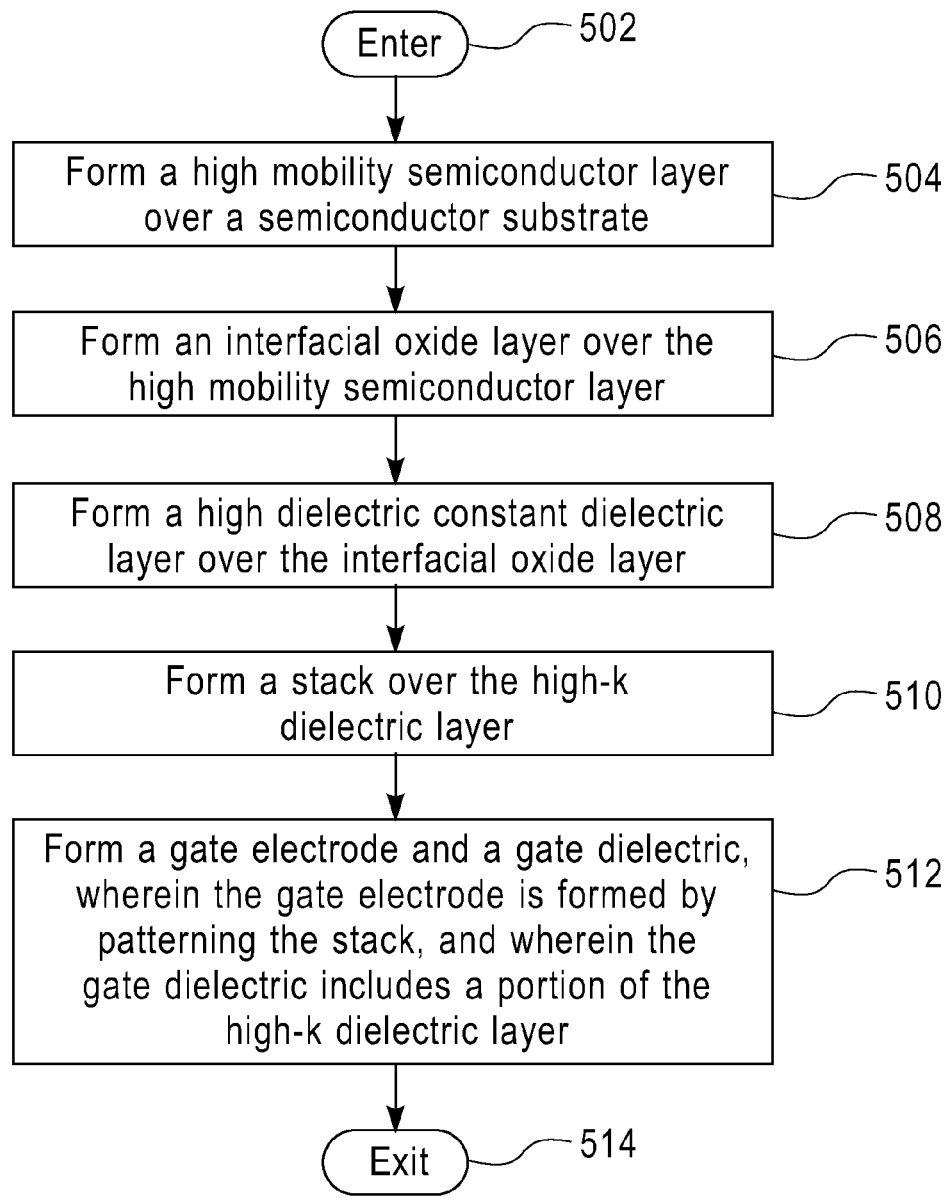
FIG. 5 is an operational flow diagram illustrating one process for forming a semiconductor structure according to one embodiment of the present invention.

FIG. 5 is an operational flow diagram illustrating a process for forming a semiconductor structure. The operational flow diagram of FIG. 5 begins at step 502 and flows directly to step 504. A high mobility semiconductor layer 104, at step 504, is formed over a semiconductor substrate 102. An interfacial oxide layer 208, at step 506, is formed over the high mobility semiconductor layer 104. A high dielectric constant dielectric layer 210, at step 508, is formed over the interfacial oxide layer 208. A stack, at step 510, is formed over the high dielectric constant dielectric layer 210. The stack comprises a lower metal layer 212 formed on the interfacial oxide layer, a scavenging metal layer 214 formed on the lower metal layer 212, and an upper metal layer 216 formed on the scavenging metal layer 214. The scavenging metal layer 214 includes a scavenging metal for which Gibbs free energy change of the chemical reaction, in which an atom constituting the semiconductor layer 104 that directly contacts/abuts the interfacial/gate oxide layer 108 (or chemical oxide layer 208) combines with a metal oxide material including the scavenging metal 114 and oxygen to form the scavenging metal 114 in elemental form and oxide of the atom constituting the semiconductor layer 104 that directly contacts the interfacial/gate oxide layer 108 (or chemical oxide layer 208), is positive. A gate electrode and a gate dielectric, at step 512, are formed. The gate electrode is formed by patterning the stack, and wherein the gate dielectric includes a portion of the high-k dielectric layer. The control flow then exits at step 514.

Figure 6:
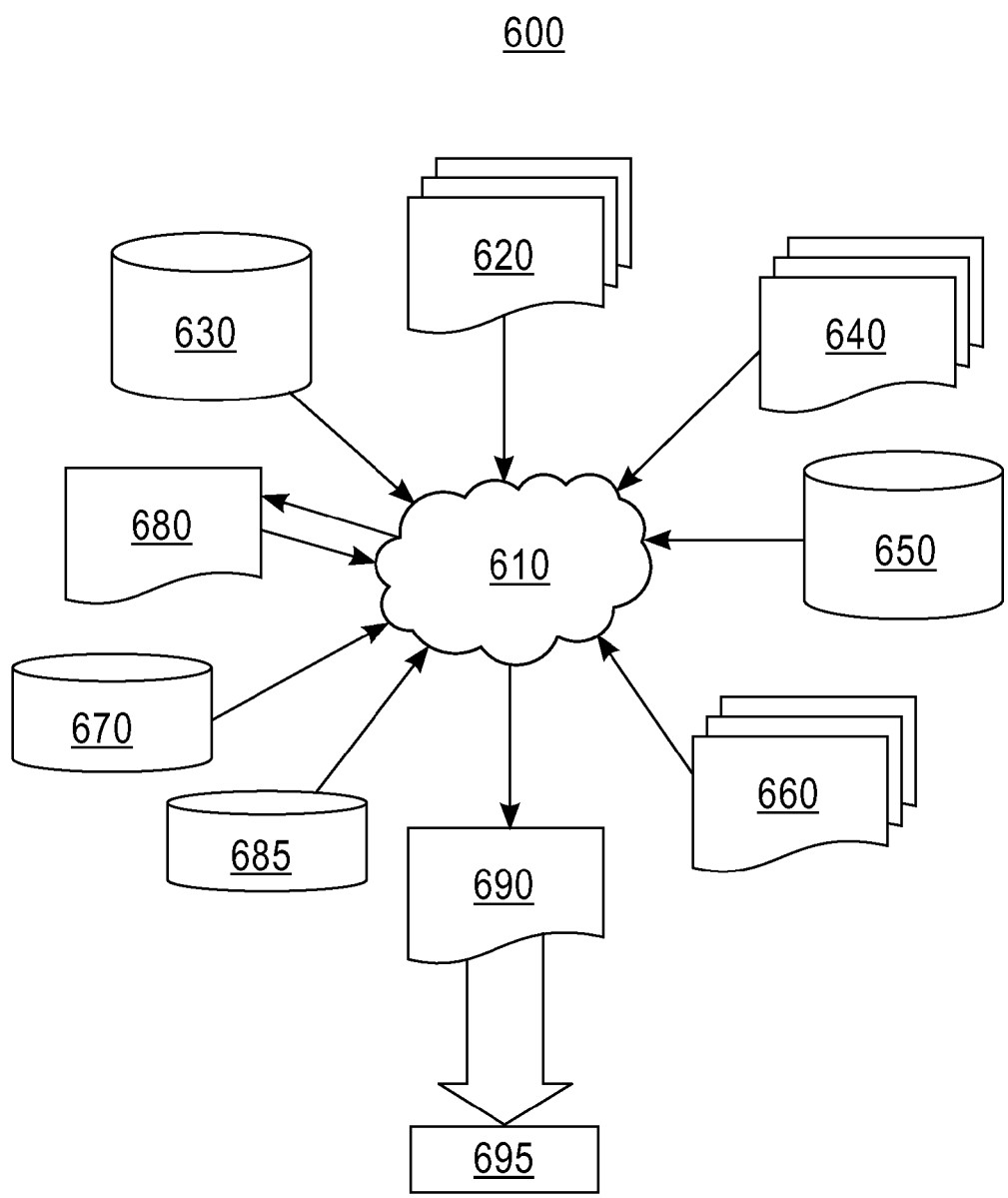
FIG. 6 is a flow diagram of a design process used in semiconductor design, manufacture, and/or test according to one embodiment of the present invention.

FIG. 6 shows a block diagram of an exemplary design flow 600 used for example, in semiconductor IC logic design, simulation, test, layout, and manufacture. Design flow 600 includes processes and mechanisms for processing design structures or devices to generate logically or otherwise functionally equivalent representations of the design structures and/or devices described above and shown in 1-4. The design structures processed and/or generated by design flow 600 may be encoded on computer-readable transmission or storage media to include data and/or instructions that when executed or otherwise processed on a data processing system generate a logically, structurally, mechanically, or otherwise functionally equivalent representation of hardware components, circuits, devices, or systems. Design flow 600 may vary depending on the type of representation being designed. For example, a design flow 600 for building an application specific IC (ASIC) may differ from a design flow 600 for designing a standard component or from a design flow 600 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 620 that is preferably processed by a design process 610. Design structure 620 may be a logical simulation design structure generated and processed by design process 610 to produce a logically equivalent functional representation of a hardware device. Design structure 620 may also or alternatively comprise data and/or program instructions that when processed by design process 610, generate a functional representation of the physical structure of a hardware device. Whether representing functional and/or structural design features, design structure 620 may be generated using electronic computer-aided design (ECAD) such as implemented by a core developer/designer. When encoded on a machine-readable data transmission, gate array, or storage medium, design structure 620 may be accessed and processed by one or more hardware and/or software modules within design process 610 to simulate or otherwise functionally represent an electronic component, circuit, electronic or logic module, apparatus, device, or system such as those shown in 1-4. As such, design structure 620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 610 preferably employs and incorporates hardware and/or software modules for synthesizing, translating, or otherwise processing a design/simulation functional equivalent of the components, circuits, devices, or logic structures shown in 1-4 to generate a netlist 680 which may contain design structures such as design structure 160. Netlist 680 may comprise, for example, compiled or otherwise processed data structures representing a list of wires, discrete components, logic gates, control circuits, I/O devices, models, etc. that describes the connections to other elements and circuits in an integrated circuit design. Netlist 680 may be synthesized using an iterative process in which netlist 680 is resynthesized one or more times depending on design specifications and parameters for the device. As with other design structure types described herein, netlist 680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 610 may include hardware and software modules for processing a variety of input data structure types including netlist 680. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 640, characterization data 650, verification data 660, design rules 670, and test data files 685 which may include input test patterns, output test results, and other testing information. Design process 610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 610 without deviating from the scope and spirit of the invention. Design process 610 may also include modules for performing standard circuit design processes such as timing analysis, verification, design rule checking, place and route operations, etc.

Design process 610 employs and incorporates logic and physical design tools such as HDL compilers and simulation model build tools to process design structure 620 together with some or all of the depicted supporting data structures along with any additional mechanical design or data (if applicable), to generate a second design structure 690. Design structure 690 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 620, design structure 690 preferably comprises one or more files, data structures, or other computer-encoded data or instructions that reside on transmission or data storage media and that when processed by an ECAD system generate a logically or otherwise functionally equivalent form of one or more of the embodiments of the invention shown in 1-4. In one embodiment, design structure 690 may comprise a compiled, executable HDL simulation model that functionally simulates the devices shown in FIGS. 1-4.

Design structure 690 may also employ a data format used for the exchange of layout data of integrated circuits and/or symbolic data format (e.g., information stored in a GDSII (GDS2), GL1, OASIS, map files, or any other suitable format for storing such design data structures). Design structure 690 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in 1-4. Design structure 690 may then proceed to a stage 695 where, for example, design structure 690: proceeds to tape-out, is released to manufacturing, is released to a mask house, is sent to another design house, is sent back to the customer, etc.

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method of forming a semiconductor structure comprising:
   forming a high mobility semiconductor layer over a semiconductor substrate, wherein the high mobility semiconductor layer comprises one of Ge, GaAs, InGaAs, InP, InSb, InAs, AlGaAs, and InAlAs;
   forming an interfacial oxide layer over the high mobility semiconductor layer;
   forming a high dielectric constant (high-k) dielectric layer over the interfacial oxide layer;
   forming a stack over the high-k dielectric layer, wherein the stack comprises a lower metal layer formed on the high-k layer, a material layer comprising a material formed on the lower metal layer, and an upper metal layer formed on the material layer, wherein the material layer consists one of B, C, P, Si, and Th, and wherein the material layer is selected based on at least the high mobility semiconductor layer,
   wherein a Gibbs free energy change of a chemical reaction, in which an atom constituting the high mobility semiconductor layer that directly contacts the interfacial oxide layer combines with a metal oxide material comprising the material and oxygen to form the material in elemental form and oxide of the atom constituting the high mobility semiconductor layer that directly contacts the interfacial oxide layer, is positive; and
   forming a gate electrode and a gate dielectric, wherein the gate electrode is formed by patterning the stack, and wherein the gate dielectric includes a portion of the high-k dielectric layer.

2. The method of claim 1, wherein the material layer comprises a thickness from 0.1 nm to 3.0 nm, wherein the lower metal layer comprises a thickness from 0.1 nm to 10 nm, and wherein the upper metal layer comprises a thickness from 0.1 nm to 10 nm.

3. The method of claim 1, wherein the lower metal layer comprises one of:
   TiN, TiC, TaN, and TaC.

4. The method of claim 1, wherein the upper metal layer comprises one of:
   TiN, TiC, TaN, and TaC.

5. The method of claim 1, further comprising:
   forming a semiconductor layer on the upper metal layer, wherein the gate electrode includes a portion of the semiconductor layer.

6. The method of claim 5, wherein the semiconductor layer comprises one of:
   polysilicon, amorphous silicon, and a low resistivity metal.

7. The method of claim 1, wherein the high-k dielectric layer comprises one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, wherein each value of x is independently from 0.5 to 3 and each value of y is independently from 0 to 2.

8. The method of claim 1, further comprising:
   forming a dielectric spacer directly on sidewalls of the gate electrode, wherein the dielectric spacer comprises an oxygen-impermeable material;
   forming a source region contacting a peripheral portion of the dielectric spacer in the semiconductor substrate; and
   forming a drain region contacting another peripheral portion of the dielectric spacer in the semiconductor substrate.

9. A method of forming a semiconductor structure comprising:
   forming a high mobility semiconductor layer over a semiconductor substrate, wherein the high mobility semiconductor layer comprises one of Ge, GaAs, InGaAs, InP, InSb, InAs, AlGaAs, and InAlAs;
   forming an interfacial oxide layer over the high mobility semiconductor layer;
   forming a high dielectric constant (high-k) dielectric layer over the interfacial oxide layer;
   forming a stack over the high-k dielectric layer, wherein the stack comprises a lower metal layer formed on the high-k layer, a material layer comprising a material formed on the lower metal layer, and an upper metal layer formed on the material layer, wherein the material layer consists one of B, C, P, and Si, and wherein the material layer is selected based on at least the high mobility semiconductor layer, wherein a Gibbs free energy change of a chemical reaction, in which an atom constituting the high mobility semiconductor layer that directly contacts the interfacial oxide layer combines with a metal oxide material comprising the material and oxygen to form the material in elemental form and oxide of the atom constituting the high mobility semiconductor layer that directly contacts the interfacial oxide layer, is positive; and forming a gate electrode and a gate dielectric, wherein the gate electrode is formed by patterning the stack, and wherein the gate dielectric includes a portion of the high-k dielectric layer.

* * * * *